United States Patent [19]
Kerstein

[11] Patent Number: 5,983,308
[45] Date of Patent: Nov. 9, 1999

[54] MULTI-TIERED INTERRUPT STRUCTURE WITH GLOBAL INTERRUPT ENABLEMENT

[75] Inventor: Denise Kerstein, Mountain View, Calif.

[73] Assignee: Advanced Micro Devices, Inc., Sunnyvale, Calif.

[21] Appl. No.: 08/993,123

[22] Filed: Dec. 18, 1997

Related U.S. Application Data

[60] Provisional application No. 60/038,025, Feb. 14, 1997.

[51] Int. Cl.⁶ .............................. G06F 9/46; G06F 15/16
[52] U.S. Cl. ........................................ 710/263; 709/224
[58] Field of Search ........................... 712/244; 710/261, 710/263, 267, 268; 709/224

[56] References Cited

U.S. PATENT DOCUMENTS

| | | |
|---|---|---|
| 5,515,376 | 5/1996 | Murthy et al. . |
| 5,701,495 | 12/1997 | Arndt et al. ............................. 710/263 |
| 5,771,374 | 6/1998 | Burshtein et al. ...................... 713/502 |
| 5,819,112 | 10/1998 | Kusters ..................................... 710/36 |
| 5,850,555 | 12/1998 | Qureshi et al. .......................... 710/260 |
| 5,875,343 | 2/1999 | Binford et al. .......................... 710/263 |
| 5,892,957 | 4/1999 | Normoyle et al. ....................... 710/263 |

*Primary Examiner*—Larry D. Donaghue

[57] ABSTRACT

An interrupt system having three tiers is provided. The first tier includes individual interrupt and enable registers, each of which provides multiple local interrupt signals in response to various events in a multiport switch. Local enable signals are supplied to the individual interrupt and enable registers to enable the local interrupt signals to be written into a global interrupt status register that provides the second tier of the interrupt system. The global interrupt status register produces several global interrupt signals, each of which represents one of the individual interrupt and enable registers. The third tier of the interrupt system includes a switch command register that generates an interrupt pending signal if any one of the global interrupt signals is produced. A global enable signal provided by the host processor enables the switch command register to produce an interrupt request signal to be supplied to a host processor.

19 Claims, 6 Drawing Sheets

MULTI-TIERED INTERRUPT STRUCTURE WITH GLOBAL INTERRUPT ENABLEMENT

The present application claims the priority of provisional application No. 60/038,025, filed Feb. 14, 1997.

TECHNICAL FIELD

This invention relates to data processing systems, and more particularly, to an interrupt structure in a data communication system.

BACKGROUND ART

The growth in computer applications that require heavy data traffic and the increasing availability of high-speed transmission lines and intelligent communication switches create a need for computer systems able to manage a huge amount of data at high rates. For example, high-speed communication systems may require processors to be interrupted at rates of 20,000–100,000 interrupts per second in response to hundreds various events.

It would be desirable to create a multi-tiered interrupt system that makes easier for a host processor to detect a particular event causing an interrupt.

Further, to prevent processing bottlenecks created by a processor, the number of interrupts should be reduced. Accordingly, it would be desirable to create an interrupt system that eliminates repeated interrupts caused by the same event to reduce the number of interrupts.

DISCLOSURE OF THE INVENTION

Accordingly, one advantage of the present invention is in providing a multi-tiered interrupt system that makes easier for a host processor to detect a particular event causing an interrupt.

Another advantage of the present invention is in providing an interrupt system that eliminates repeated interrupts caused by the same event.

The above and other advantages of the invention are achieved, at least in part, by providing a system for producing an interrupt request signal to interrupt a processor in a data communication system. The system comprises multiple local interrupt registers, each of which produces a plurality of local interrupt signals in response to various events in the data communication system. A global interrupt register is coupled to the local interrupt registers for producing global interrupt signals, each of which represents a set of the local interrupt signals. A command register is coupled to the global interrupt register for producing an interrupt pending signal in response to any one of the global interrupt signals.

In accordance with one aspect of the invention, the command register is responsive to a global enable signal controlled by the processor for producing the interrupt request signal if the global enable signal is at a first logic level and for preventing the interrupt request signal from being produced if the global enable signal is at a second logic level.

In accordance with another aspect of the invention, the local interrupt registers are responsive to local enable signals controlled by the processor for producing a local interrupt signal if the corresponding local enable signal is at a first logic level and for preventing the local interrupt signals from being produced if the corresponding local enable signal is at a second logic level.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
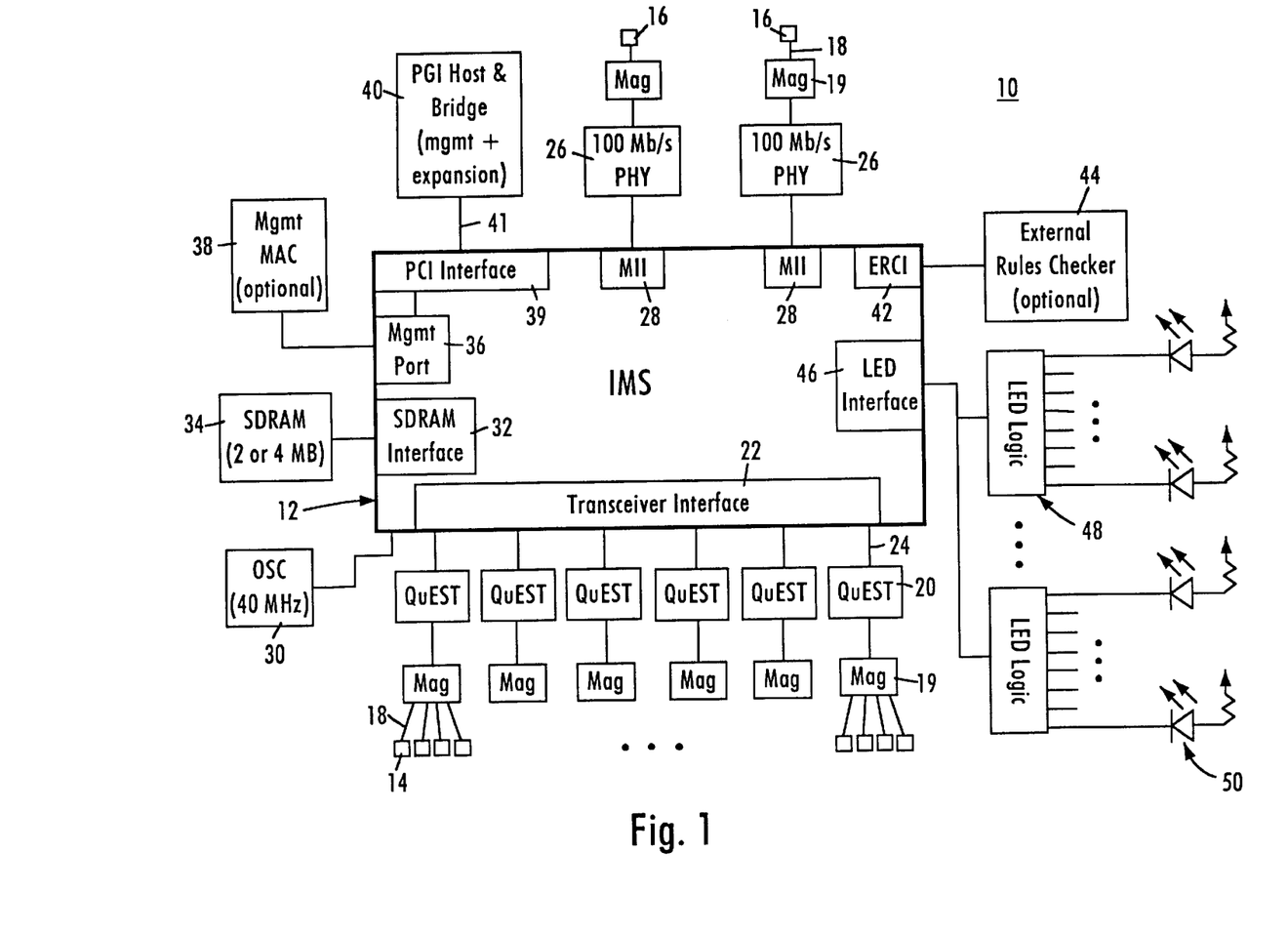
FIG. 1 is a block diagram of an exemplary system in which the present invention may be advantageously employed.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 via a management MAC interface 38. Also, the multiport switch 12 includes a PCI interface 39 connected to a host processor 40 via a PCI bus 41. The PCI interface 39 enables the PCI host processor 40 to access the internal IMS registers and the external memory 34. Alternatively, a PCI expansion bus may be attached to the PCI interface 39 to connect the switch 12 to other IMS devices.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figure 2:
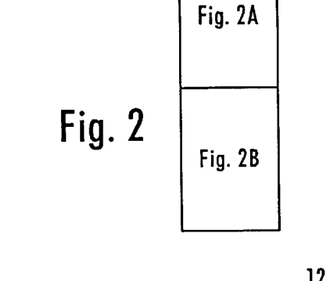
FIG. 2 is a block diagram of a multiport switch.
Figure 2A:
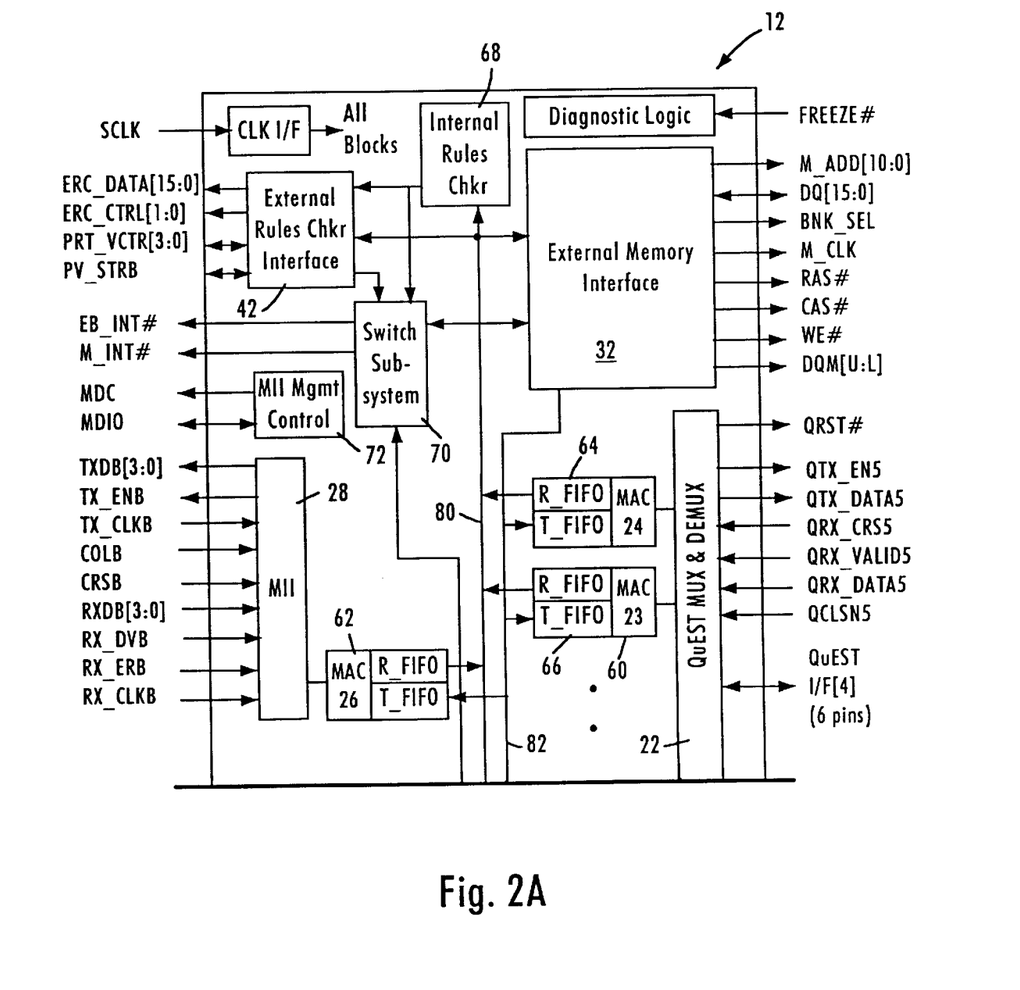
Figure 2B:
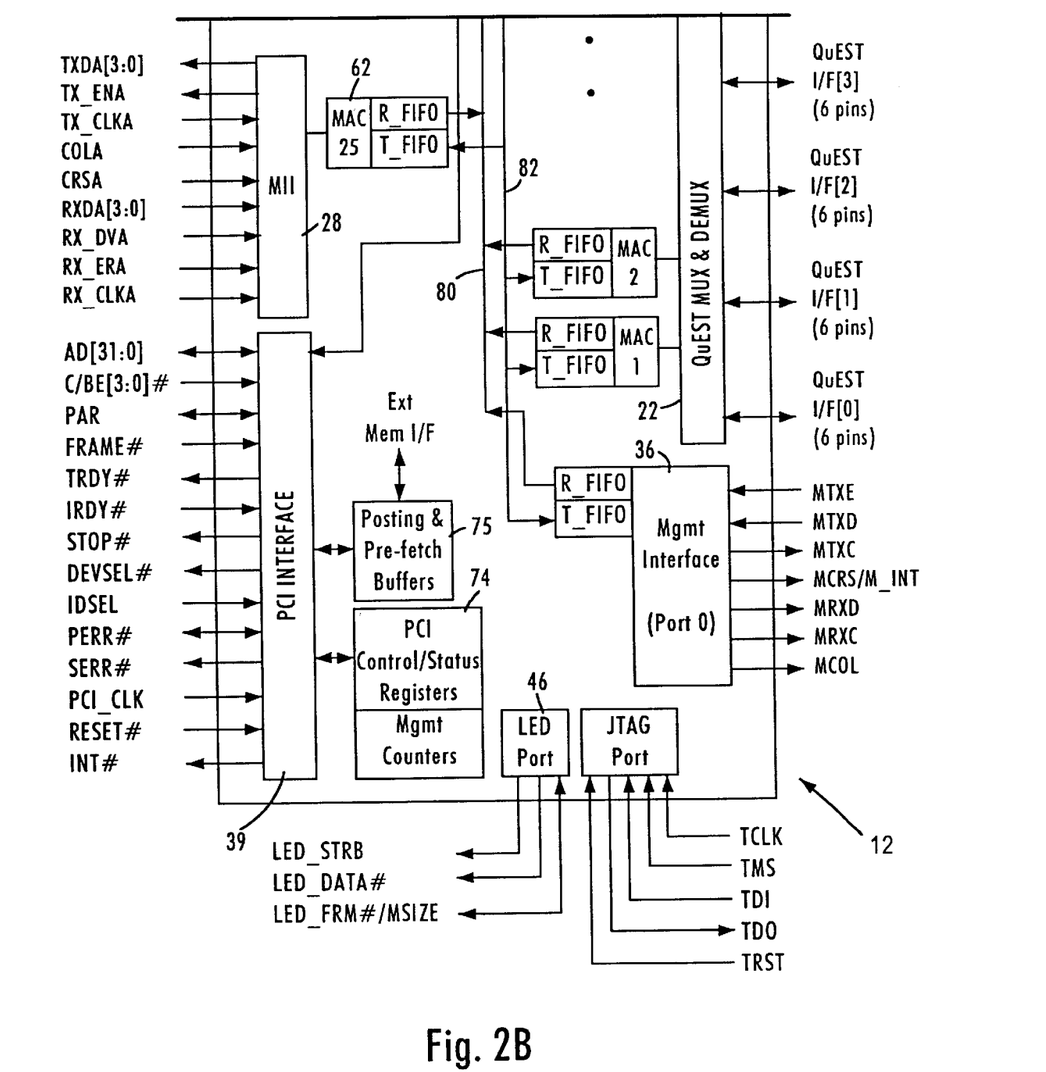

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24) and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 32, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32 and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data IO (MDIO) signal path.

The PCI interface 39 may be a 32-bit PCI revision 2.1 compliant slave interface for providing the PCI host processor 40 with access to internal IMS status and configuration registers 74 and to the external memory SDRAM 34. Write posting and read prefetch buffers 75 are arranged between the PCI interface 39 and the external memory interface to support host processor access to the external memory 32. The PCI interface 39 can also be coupled to an expansion bus for connecting multiple IMS devices with each other.

The management port 36 interfaces to an external MAC engine through a standard seven-wire inverted serial GPSI interface, enabling a host controller access to the multiport switch 12 via a standard MAC layer protocol.

Figure 3:
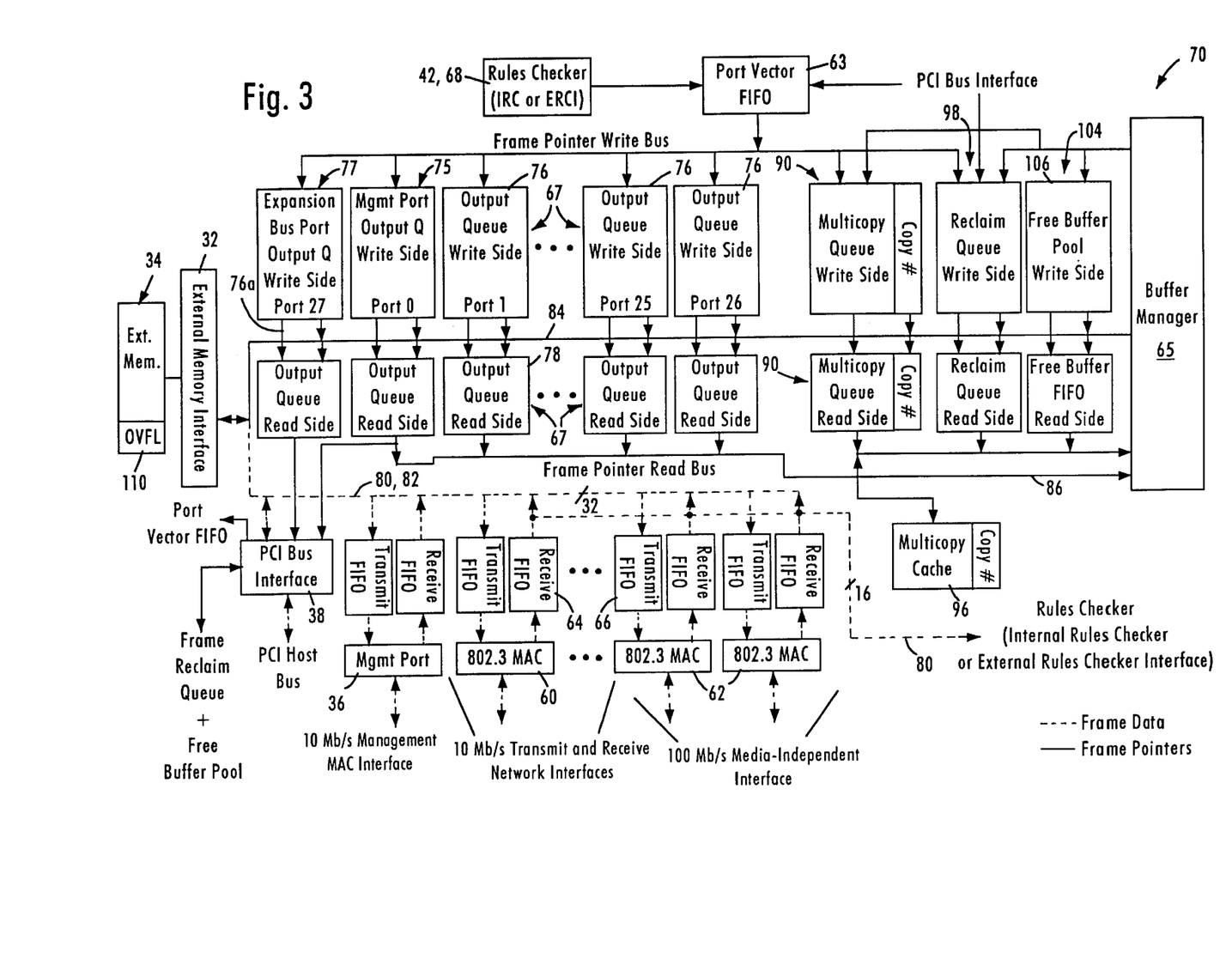
FIG. 3 depicts the switch subsystem of the multiport switch according to an exemplary embodiment of the present invention.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements. The switch subsystem 70 contains the core switching engine for receiving and forwarding frames. The main functional blocks used to implement the switching engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98. The operation and structure of these functional blocks will be described in more detail, but a brief overview of the switch subsystem 70 of FIG. 3 is first presented to provide context to the later discussion of the individual elements.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66.

Frames, whether unicopy or multicopy, are received by the internal MAC engines 60, 62, or 36, and placed in the corresponding receive FIFO 64. Each data frame has a header including at least a destination address, a source address, and type/length information. The header is provided to a rules checker (i.e., either the internal rules checker 68 or the external rules checker interface 42). The rules checker, based on the information in the header, determines from where the frame packet will be cast, i.e., through which port or ports will the frame packet be transmitted.

At the same time as the rules checker 42 or 68 is making its forwarding determination, the buffer manager 65 obtains a free frame pointer from the free buffer pool 104. The free frame pointer specifies a location in external memory 36 available for storing the data frame currently stored in the receive FIFO 64. The buffer manager 65 transfers the data frame from the receive FIFO 64 over a data bus 80 (see FIG. 2) to the external memory 34 in a direct memory access (DMA) transaction, and the data frame is stored in the location pointed to by the free frame pointer obtained from the free buffer pool 104.

The buffer manager 65 also sends the free frame pointer to the rules checker 42 or 68 to enable the appropriate rules checker to process the header information while maintaining the storage location of the data frame. This free buffer pointer is now referred to merely as a frame pointer, since it points to the memory location in the external memory 34 where the frame is stored. The rules checker 42 or 68 makes the forwarding decision, where the rules checker identifies at least one destination port for the data frame stored in the external memory 34 based on the corresponding header information, and generates a forwarding instruction in the form of a "port vector". In the exemplary illustrated embodiment, the port vector is a 28-bit vector with a bit set for each output port identified as a destination port to which the data frame should be forwarded. Assuming that the received frame is a unicopy frame, only one bit corresponding to the one destination port is set in the port vector generated by the rules checker 42 or 68. Hence, the rules checker uses the port vector to assign the frame pointer to at least one destination port.

The rules checker 42 or 68 places the port vector and the corresponding frame pointer (as well as a control opcode and a VLAN index) into the port vector FIFO 63. The port vector is examined by the port vector FIFO 63 to determine into which particular output queue 67 (or queues) the frame pointer associated with the port vector should be input. The port vector FIFO 63 assigns the frame pointer to the appropriate destination port(s) by placing the frame pointer into the top of the appropriate output queue 67, queuing the transmission of the data frame from the corresponding destination port. Hence, the frame pointer becomes an "assigned frame pointer," where it is assigned to a destination port.

At some point in time, the assigned frame pointer reaches the bottom of the output queue 67 after passing through the output queue 67. The buffer manager 65 takes the assigned frame pointer from the bottom of the output queue 67 using a frame pointer read bus 86, fetches the corresponding data frame in a DMA transaction from the location in external memory 36 pointed to by the assigned frame pointer and places the fetched data frame into the appropriate transmit FIFO 66 via a data bus 82 (see FIG. 2) for transmission by the corresponding MAC layer.

A multicopy transmission is similar to the unicopy transmission, except that the port vector has multiple bits set, designating the multiple destination ports from which the frame will be transmitted. The frame pointer is assigned (i.e., stored in) each of the appropriate output queues 67 and transmitted from the corresponding transmit FIFOs 54.

The buffer manager 65 uses the special control queues, e.g., the free buffer pool 104, the multicopy queue 90, the reclaim queue 98, and the multicopy cache 96 to manage the process of allocating buffers to store received data frames, and retrieving buffers for re-use once the frame has been transmitted to its designated output port(s). The buffer manager 65 also maintains "overflow" regions in external memory 36 for the output queues 67, 75, 77 and the control queues 104, 90 and 98. Specifically, these queues each include a three-part configuration including on-chip and off-chip storage locations. On-chip storage is preferable for high performance, where all of the queuing structure is maintained on the chip (referring to the multiport switch 12). However, the real estate on a chip is very expensive and real estate costs create a problem when the chip is designed to switch, and needs to queue, a large number of entries. The present invention solves this dilemma by providing a single output queue that includes a high performance, low capacity section that is on-chip, and an overflow area that is off-chip, i.e., is implemented on a separate discrete memory chip 34. The overflow area thus allows the queue to serve as a large capacity queue as needed and is configured within the output queue in a manner that a relatively lower performance of the off-chip overflow area does not adversely affect the overall performance of the output queue.

Each logical queue 67, 75, 77, 90, 98, and 104 of the present invention includes a write-side queue 76 and a read-side queue 78 located on the chip 12, and an output queue overflow area (generally designated as 110) located in an assigned portion of the external memory 34. Access to the external memory 34 for all of the output queues 67 is through the external memory interface 32, as described earlier. The present invention takes advantage of the bursting nature of current external memories, so that the overflow data (e.g., frame pointers) is sent on and off the chip to the overflow queue area 110 in bursts over the bus 84 to the external memory 34.

The write-side queue 76 and the read-side queue 78 located on the chip 12 are considered to be small, expensive, and high-performance resources. By contrast, the overflow area 110, forming the third part of the output queue 67, provides a large, inexpensive, low-performance, large capacity path.

Each buffer 67, 75, 77, 90, 98, and 104 operates by the corresponding write-side queue 76 receiving the corresponding frame pointer entry at an input end of the write-side queue 76. The frame pointer points to the first buffer location in external memory storing the first 256 bytes of a data frame.

After the entry flows through and reaches the output end at the bottom of the write-side queue 76, control logic associated with the output queue 67 selects whether the entry should be output to the corresponding assigned portion 110 of the external memory 34 or the read-side queue 78. If there is available space in the read-side queue 78 and the overflow area 110 for that output queue 67 is empty, then one or more entries are passed directly from the write-side queue 76 to the read-side queue 78. This passing of the entry or entries directly from the write-side queue 76 to the read-side queue 78 is performed entirely on the chip 12 and, thus, provides a low-latency, fast flow-through of an entry.

If the read-side queue 78 is full, but there is not yet a burst-size amount of data in the write-side queue 76, then the entry remains in the write-side queue 76. If the read-side queue 78 is full and there is at least a burst-size amount of data (e.g., 16 bytes worth of entries) in the write-side queue 76, then the data is written in a burst fashion by the buffer manager 65 into the overflow area 110 in the corresponding assigned portion of the external memory 34. Eventually, the read-side queue 78 will empty, and, if there is data in the overflow area 110, the buffer manager 65 will supply a burst of data from the overflow area 110 into the read-side queue 78 when the read-side queue 78 has enough space to accommodate the burst-size amount of data. Hence, the read-side queue 78 selectively receives the frame pointer from the write-side queue 76 or the assigned portion 110 of the external memory 34.

Hence, if an output queue 67 begins to receive a large number of entries (e.g., frame pointers), these entries can be placed into the overflow area 110 to avoid overflowing the on-chip queue 78, minimizing possibility of discarding frames. The total amount of memory dedicated to the overflow areas 110 may also be readily changed by changing the size of the external memory 36. Furthermore, the sizes of the individual specific overflow areas 110 are programmable to customize the queue sizes, without impacting the performance of the output queues 74.

The multiport switch as depicted in FIGS. 1 and 2 has twenty-eight output queues serving the twenty-four 10 Mb/s user ports 60, the two 100 Mb/s server ports 62, the management port 36, and the expansion bus port 38, respectively. The output queues 67, 75 and 77 provide temporary storage for frame pointers when they are queued for transmission. Queuing takes the form of the port vector FIFO 70 writing frame pointers into the various output queues 67, 75 and 77 indicated in a forwarding port vector.

Figure 4:
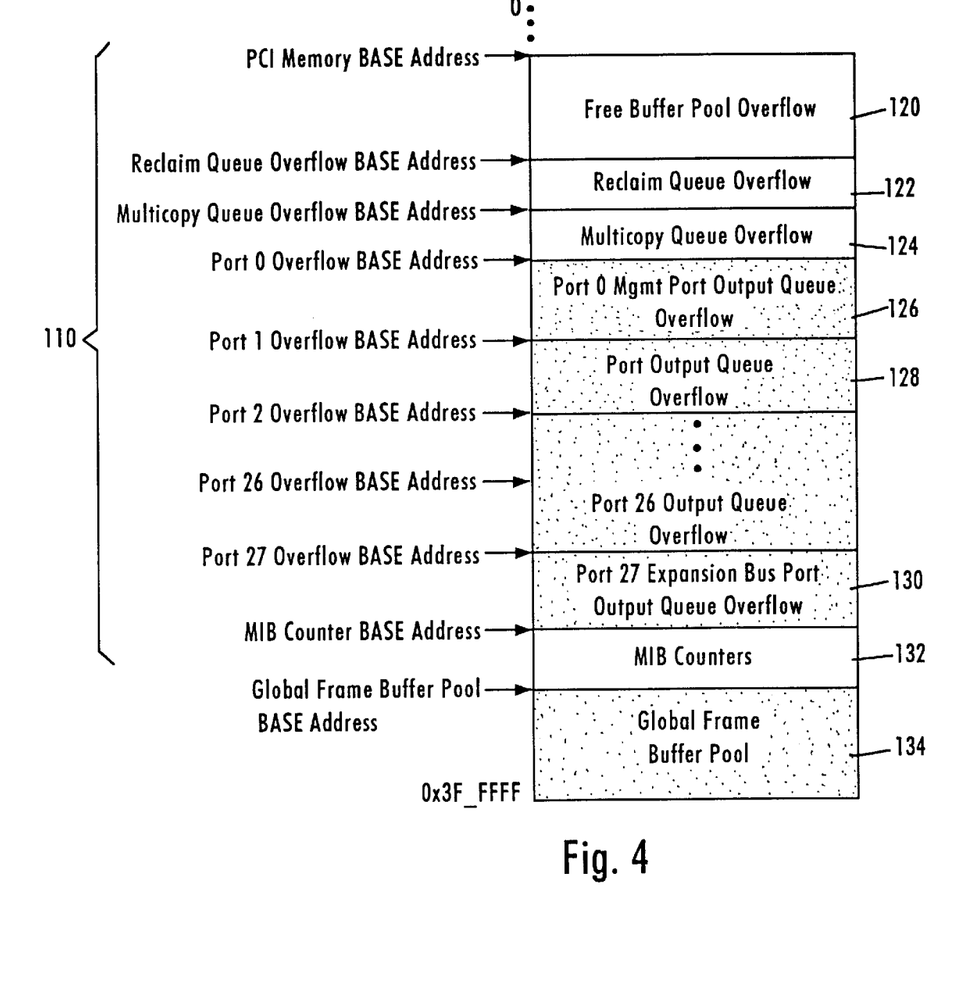
FIG. 4 is a diagram illustrating an exemplary map of an external memory in the multiport switch.

FIG. 4 is a diagram illustrating an exemplary map of the external memory 34. The overall capacity of the external memory 34 may be, for example, 4 Mb, although other capacity memories are employed in different embodiments. The use of an external memory 34 for the overflow areas according to the present invention permits increasing or decreasing the size of the output queues by simply changing the external memory. This is an advantage over systems in which the queue structure is entirely on the chip, as the overall queuing capacity is set at manufacture of the chip.

To satisfy the overflow storage requirements of the switch 12, the overflow region 110 of the external memory 34 has assigned memory portions for a free buffer pool overflow 120, a reclaim queue overflow 122, a multicopy queue overflow 124, a management port output queue overflow 126, output queue overflows 128 for each of the 10 Mb/s and 100 Mb/s destination ports (Ports 0–26), and an expansion bus port (Port 27) output queue overflow 130. The memory 34 also includes assigned portions for the MIB counters 132, and the global frame buffer pool 134.

The BASE Address for the entire memory region is programmable in a memory base address register among the registers 74 on the chip. The BASE Address for each area in the external memory map is programmable in the register set. No length register is required, since the length for a given area is equal to the area from that area's BASE Address to the BASE Address of the next adjacent area in the mapping.

Since the length (and therefore capacity) of each of the individual overflow areas is programmable, the overall capacity of each queue is programmable. This feature of the present invention permits customization of the switch to provide particular output queues with increased capacity, as needed.

The overflow areas 110 store excess entries that do not fit into the control queues on the chip 12. For example, the free buffer pool overflow area 120 stores for the free buffer pool 104 the excess free frame pointers identifying the currently unused buffers in the global frame buffer pool 134. The reclaim queue overflow area 122 stores for the reclaim queue 98 excess frame pointers to linked-list chains that are no longer needed. The multicopy queue overflow area 124 stores for the multicopy queue 90 excess frame pointers with copy numbers ">=1" (for queued frame pointers) and frame pointers with copy numbers "−1" (for successfully transmitted frames). The management port output queue overflow area 126 stores for the management port queue 74 excess assigned frame pointers awaiting transmission to the management port 36 (Port 0). Output queue overflow areas 128 store excess assigned frame pointers awaiting transmission to the appropriate 10 Mb/s ports (Ports 1–24) or 100 Mb/s ports (Ports 25–26) for the respective port queues 67. The expansion bus port output queue overflow area 130 for the expansion bus port (Port 27) queue 77 stores frame pointers awaiting transmission to the expansion bus port.

The MIB counter region 132 contains all the per port statistics which are updated periodically by the switch 12. The switch 12 maintains 8-bit and 16-bit counters on-chip for storing MIB statistics. The switch 12 updates the 32-bit or 64-bit MIB counters in external memory 36 with the frequency required to prevent loss of MIB data.

The global frame buffer pool 134 contains buffers in linked-lists which store received frame data. At any given time, these linked lists contain valid frame data, obsolete buffers which will be returned by the buffer manager 72 to the free buffer pool 104 or locations owned by the PCI host processor 40.

As discussed above, the multiport switch 12 comprises the PCI interface 39 which may be a 32-bit PCI revision 2.1 compliant interface arranged on the IMS chip to support communications with the host processor 40 via the PCI bus 41. The PCI interface 39 allows the PCI host processor 40 to read and write from and to the internal IMS status and configuration registers 74 and to read and write from and to the external memory 34. During PCI data transfer operations, the host processor 40 acts as a master that controls the PCI bus 41 to send and receive signals to and from the slave PCI interface 39.

The PCI interface 39 may contain pins INT#, M_INT3 and EB_INT that provide the host processor 40 with interrupt signals. In particular, the INT# pin supplies an interrupt signal which indicates to the host processor 40 that one or more interrupt conditions has occurred. The M_INT# signal notifies the host processor 40 that the management port output queue 75 contains frame pointers for frames which are queued for transmission to the PCI interface 39. The EB_INT# signal notifies the host processor 40 that the expansion bus port output queue 77 contains frame pointers for frames which are queued for transmission to the PCI interface 39.

Figure 5:
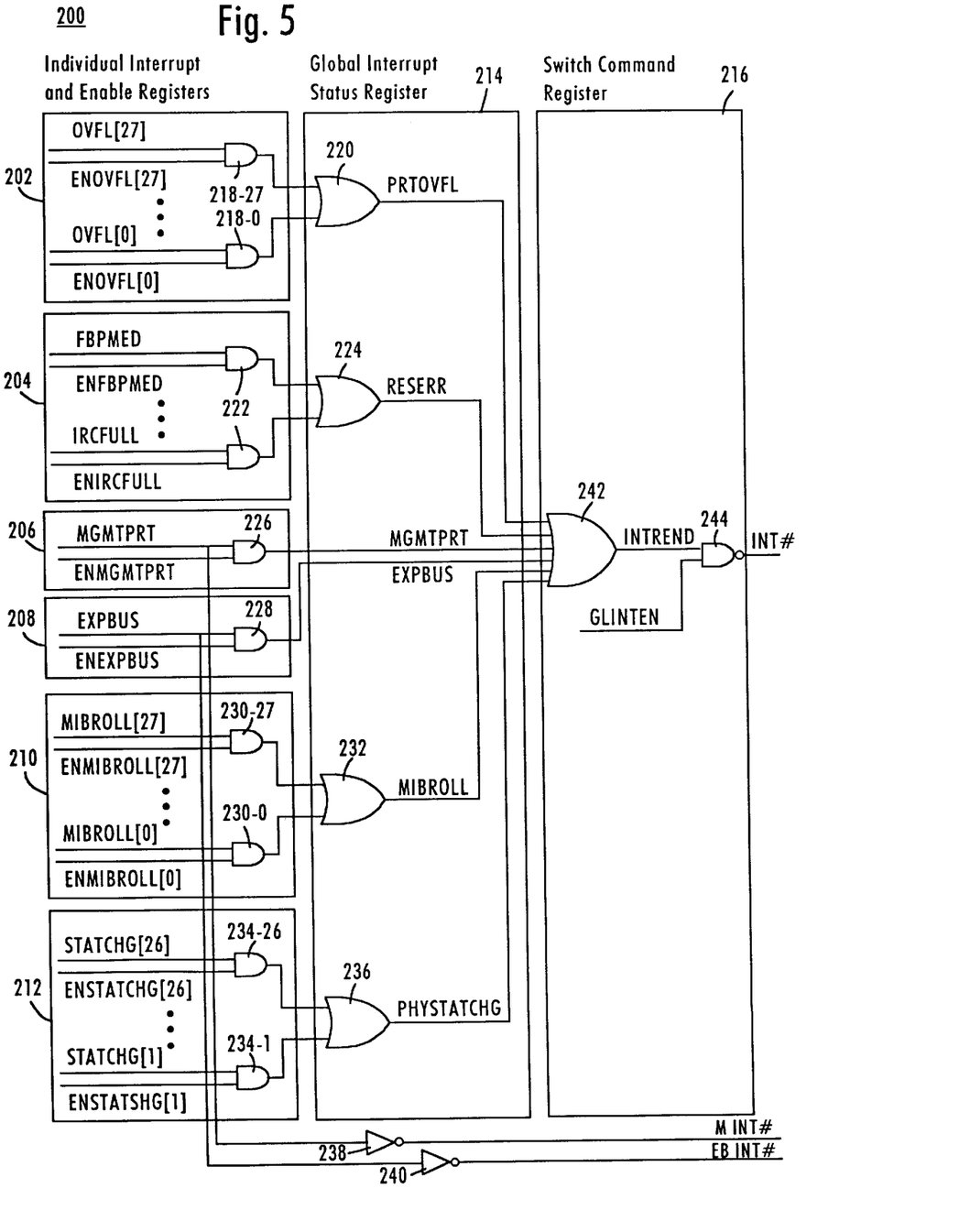
FIG. 5 is a diagram of an interrupt system in the multiport switch.

Referring to FIG. 5, an interrupt system 200 that produces the interrupt signals INT#, M_INT# and EB_INT# comprises three tiers. The first tier includes individual interrupt and enable registers, such as port overflow interrupt and enable registers 202, resource error interrupt and enable registers 204, management port interrupt and enable registers 206, expansion bus port interrupt and enable registers 208, MIB counter rollover interrupt and enable registers 210, and PHY status change interrupt and enable registers 212. The second tier of the interrupt system 200 is provided by a global interrupt status register 214. The third tier is supported by a switch command register 216.

The port overflow interrupt and enable registers 202 contain a 28-bit overflow signal OVFL[0:27] which indicates whether any of the output queues 67 for ports 0–27 has overflowed. For example, when the output queue for port 0 has overflowed, the OVFL[0] bit may be set. The overflowed conditions of the port 1 output queue may be indicated by the OVFL[1] bit equal to 1, etc. Finally, the OVFL[27] bit equal to 1 indicates that the output queue for port 27 has overflowed.

The OVFL[0:27] bits are supplied to first inputs of corresponding AND gates 218–0 to 218–27. Second inputs of the AND gates 218–0 to 218–27 receive corresponding bits of 28-bit overflow enable signal ENOVFL[0:27]. When any bit of the ENOVFL[0:27] signal is asserted, the corresponding bit of the OVFL[0:27] signal is enabled to set a port overflow interrupt bit PRTOVFL in the global interrupt status register 214. The PRTOVFL bit is produced at the output of an OR gate 220 having 28 inputs supplied with output signals of the AND gates 218–0 to 218–27. Thus, the PRTOVFL bit is equal to 1 when the output queue for any port has overflowed and the corresponding enable bit is set.

The resource error interrupt and enable registers 204 contain resource error interrupt bits that indicate whether any of the control queues 90, 98, and 104 has an error. For example, the registers 204 may contain a free buffer pool medium interrupt bit FBPMED which may be set to indicate that a space available in the free buffer pool 104 is less than a preset amount. An internal address checker full interrupt bit IRCFULL in the registers 204 may be set to indicate that there is no more space in the internal rules checker 68. Other interrupt bits in the registers 204 may relate to conditions of the reclaim queue 98 and multicopy queue 90.

Each resource error interrupt bit is accompanied with the corresponding resource error enable interrupt bit. For example, an enable free buffer pool medium interrupt ENFBPMED enables the FBPMED bit to cause an interrupt. An enable internal address checker full interrupt bit ENIRC-FULL enables the IRCFULL bit to cause an interrupt. Each pair of resource error interrupt bit and its corresponding enable interrupt bit is supplied to an AND gate 222. Output signals of all AND gates 222 are fed to inputs of an OR gate 224 that produces a resource error interrupt bit RESERR in the global interrupt status register 224. Thus, the RESERR bit is equal to 1 when any of the control queues 90, 98, and 104 has an error, and the ENRESERR bit is set.

The management port interrupt and enable registers 206 indicate when the management port output queue 75 requires service. When the management port output queue 75 contains frame pointers, a management port interrupt bit MGMTPRT in the registers 206 is set. An enable management port interrupt bit ENMGMTPRT enables the MGMT-PRT bit to cause interrupt. The MGMTPRT and ENMG-MTPRT bits are supplied to an AND gate 226 that produces a management port interrupt bit MGMTPRT in the global interrupt status register 214. This bit is set when the management port output queue 75 requires service, and the ENMGMTPRT bit is set.

The expansion bus port interrupt and enable registers 208 indicate when the expansion bus port output queue 77 requires service. When the expansion bus port output queue 77 contains frame pointers, an expansion bus port interrupt bit EXPBUS in the registers 208 is set. An enable expansion bus port interrupt bit ENEXPBUS enables the EXPBUS bit to cause interrupt. The EXPBUS and ENEXPBUS bits are supplied to an AND gate 228 that produces an expansion bus port interrupt bit EXPBUS in the global interrupt status register 214. This bit is set when the expansion bus port output queue 77 requires service and the ENEXPBUS bit is set.

The MIB counter rollover interrupt and enable registers 210 indicates whether the MIB counter 132 for any port has rolled from bit 30 to bit 31. The registers 210 contain a 28-bit signal MIBROLL[0:27] which indicates when any of the MIB counters 132 for ports 0–27 has rolled. For example, when the MIB counter for port 0 has rolled, the MIBROLL[0] bit may be set. The rollover condition of the MIB counter for port 1 may be indicated by the MIBROLL[1] bit equal to 1, etc. Finally, the MIBROLL[27] bit equal to 1 indicates that the MIB counter for port 27 has rolled.

The MIBROLL[0:27] bits are supplied to first inputs of corresponding AND gates 230–0 to 230–27. Second inputs of the AND gates 230–0 to 230–27 receive corresponding bits of a 28-bit MIB roll interrupt enable signal ENMIBROLL[0:27]. When any bit of the ENMIBROLL[0:27] signal is set, the corresponding bit of the MIBROLL[0:27] signal is enabled to set an MIB roll interrupt bit MIBROLL in the global interrupt status register 214. The MIBROLL bit is produced at the output of an OR gate 232 having 28 inputs supplied with output signals of the AND gates 230–0 to 230–27. Thus, the MIBROLL bit is equal to 1 when the MIB counter for any port has rolled and the corresponding enable bit is set.

The PHY status change interrupt and enable registers 212 indicates whether the configuration of the physical device 26 for any port 1–26 has changed. Such a change may be registered in the status register of the MII 28 for the corresponding port. For instance, a bit 1 in a 26-bit status change signal STATCHG[1:26] may be set when the MII status for port 1 has changed. Bit STATCHG[2] equal to 1 indicates the MII status change for port 2, etc. Finally, bit STATCHG[26] may be set when the MII status change for port 26 is detected.

Each bit of the STATCHG[1:26] signal, together with the corresponding enable bit ENSTATCHG, is supplied to the corresponding one of AND gates 234–1 to 234–26. An OR gate 236 connected to the AND gates 234–1 to 234–26 produces a PHY status change interrupt bit PYSTATCHG in the global interrupt status register 214. Thus, the PYSTATCHG is set when the MII status has changed for any of ports 1–26 and the corresponding enable bit is set.

Via inverters 238, 240, the MGMTRPRT and EXPBUS signals from the registers 206 and 208 are respectively supplied to the pins M_INT# and EB_INT# of the PCI interface 39. The M_INT# signal notifies the host processor 40 that the management port output queue 75 contains frame pointers for frames which are queued for transmission to the PCI interface 39. The EB_INT# signal notifies the host processor 40 that the expansion bus port output queue 77 contains frame pointers for frames which are queued for transmission to the PCI interface 39.

The global interrupt bits PRTOVFL, RESERR, MGMTPRT, EXPBUS, MIBROLL, and PHYSTATCHG from the global interrupt status register 214 are fed to an OR gate 242 that produces an interrupt pending bit INTPED in the switch command register 216. Also, this register contains a global interrupt enable bit GLINTEN that together with the INTPED bit is supplied to a NAND gate 244 that produces the INT# interrupt signal supplied via the PCI interface 139 to the host processor 40. The INT# signal is produced when any of the global interrupt bits are set, and the GLINTEN bit is set. When the host processor 40 receives the INT# interrupt signal, it clears the GLINTEN bit to prevent another interrupt signal from being produced. The GLINTEN bit may be reinstated after the host processor 40 completes servicing previously received interrupt.

When the host processor 40 receives the INT# interrupt signal, it may check the global interrupt status register 214 to detect a type of event that causes the interrupt. Then, the host processor 40 may read one of the individual interrupt and enable registers 202–212 that is responsible for producing an interrupt in response to the detected type of event. Thus, the host processor 40 may determine the event that causes the interrupt. The corresponding local enable bit in the registers 202–212 may be cleared to prevent a repeated interrupt caused by the same event.

For example, if the global interrupt status register 214 contains the PRTOVFL bit equal to 1, the host processor 40 concludes that the current interrupt is caused by the overflowed condition of one of the output queues for ports 0–27. Accordingly, the host processor 40 examines the port overflow interrupt and enable registers 202. If for example, the OVFL[27] bit is set indicating that the current interrupt is caused by the overflowed condition of the output queue for port 27, the host processor may clear the ENOVFL[27] bit to prevent the repeated interrupt caused by the same event.

There accordingly has been described an interrupt system having three tiers. The first tier includes individual interrupt and enable registers, each of which provides multiple local interrupt signals in response to various events in a multiport switch. Local enable signals are supplied to the individual interrupt and enable registers to enable the local interrupt signals to be written into a global interrupt status register that provides the second tier of the interrupt system. The global interrupt status register produces several global interrupt signals, each of which represents one of the individual interrupt and enable registers. The third tier of the interrupt system includes a switch command register that generates an interrupt pending signal if any one of the global interrupt signals is produced. A global enable signal provided by the host processor enables the switch command register to produce an interrupt request signal to be supplied to a host processor.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

What is claimed is:

1. A system for producing an interrupt request signal to interrupt a processor in response to various events in a data communication system, comprising:

a plurality of local interrupt registers for producing a local interrupt signal in response to said events, each of said local interrupt signals being produced in response to each of said events, a global interrupt register coupled to said plurality of local interrupt registers for producing global interrupt signals, each of said global interrupt signals being produced in response to a set of said local interrupt signals, and a command register coupled to said global interrupt register for producing said interrupt request signal in response to said global interrupt signals.

2. The system of claim 1, wherein said command register is responsive to a global enable signal controlled by said processor for preventing said command register from producing said interrupt request signal.

3. The system of claim 2, wherein a local interrupt register of said plurality of local interrupt registers is responsive to a group of said events to produce the set of said local interrupt signals.

4. The system of claim 3, wherein the local interrupt register is responsive to a local enable signal controlled by said processor for preventing the local interrupt register from producing a local interrupt signal of said set.

5. The system of claim 4, wherein said global interrupt register is responsive to said set of the local interrupt signals for producing a global interrupt signal when an event of said group occurs.

6. The system of claim 5, wherein said global interrupt register comprises a global gate for producing the global interrupt signal when any local interrupt signal of said set is supplied.

7. The system of claim 6, wherein said command register comprises a command gate for producing an interrupt pending signal when any global interrupt signal is supplied.

8. The system of claim 7, wherein said command register further comprises an enable gate for producing said interrupt request signal only when said interrupt pending signal and said global enable signals are supplied.

9. A multiport switch controlled by a host processor for supporting data exchange between a plurality of communication ports, comprising:

a plurality of local registers for storing port status data indicating data communication conditions at said ports, said plurality of local registers producing a local interrupt signal when an interrupt condition exists at a port, a global register coupled to said plurality of local registers for storing global interrupt data indicating a type of the interrupt condition, and a switch command register coupled to said global register for producing an interrupt request signal to interrupt said host processor in response to a predetermined combination of said global interrupt data.

10. The switch of claim 9, wherein said switch command register is responsive to said host processor for producing said interrupt request signal only if a global enabling command is supplied by said host processor.

11. The switch of claim 10, wherein said plurality of local registers are responsive to said host processor for producing said local interrupt signal only if a local enabling command is supplied from said host processor.

12. The switch of claim 11, wherein a local register of said plurality of local registers produces said local interrupt signal when the interrupt condition exists at any of the ports.

13. The switch of claim 12, wherein said local register produces a port overflow interrupt signal when an output queue at any of the ports has overflowed.

14. The switch of claim 12, wherein said local register produces a resource error interrupt signal when any control queue has an error.

15. The switch of claim 12, wherein said local register produces a management port interrupt signal when a management port requires service.

16. The switch of claim 12, wherein said local register produces an expansion bus interrupt signal when an expansion bus port requires service.

17. The switch of claim 12, wherein said local register produces a status change interrupt signal when a communication device connected to any of the ports changes its configuration.

18. The switch of claim 12, wherein said global interrupt register is connected to said local register for initiating said interrupt request signal in response to said local interrupt signal.

19. The switch of claim 12, wherein said global enabling command is supplied after said host processor completes servicing a previous interrupt.

* * * * *